(12) United States Patent
Tailliet (10) Patent No.: US 8,228,732 B2
(45) Date of Patent: Jul. 24, 2012

(54) EEPROM MEMORY PROTECTED AGAINST THE EFFECTS OF BREAKDOWN OF MOS TRANSISTORS

(75) Inventor: Francois Tailliet, Fuveau (FR)

(73) Assignee: STMicroelectronics Rousset SAS, Rousset (FR)

( * ) Notice: Subject to any disclaimer, the term of this patent is extended or adjusted under 35 U.S.C. 154(b) by 336 days.

(21) Appl. No.: 12/613,341

(22) Filed: Nov. 5, 2009

(65) Prior Publication Data

US 2010/0110791 A1    May 6, 2010

(30) Foreign Application Priority Data

Nov. 5, 2008   (FR) ...................................... 08 06175

(51) Int. Cl.
    *G11C 11/34*    (2006.01)
(52) U.S. Cl. ................................ 365/185.09; 365/185.24
(58) Field of Classification Search ............. 365/185.09, 365/185.24
    See application file for complete search history.

(56) References Cited

U.S. PATENT DOCUMENTS

| | | | |
|---|---|---|---|
| 6,934,192 B2 | 8/2005 | Tailliet et al. | |
| 7,239,192 B2 | 7/2007 | Tailliet | |
| 7,239,725 B2 | 7/2007 | Dobashi | |
| 2004/0027851 A1* | 2/2004 | Lai | 365/149 |
| 2009/0161430 A1* | 6/2009 | Allen et al. | 365/185.09 |

FOREIGN PATENT DOCUMENTS

EP    0 292 658 A2    11/1988

OTHER PUBLICATIONS

Bushnell et al., "Essentials of Electronic Testing for Digital, Memory and Mixed-Signal VLSI Circuits," Kluwer Academic Publishers, Norwell, MA. (2000), pp. 262-264.

* cited by examiner

*Primary Examiner* — Michael Tran
(74) *Attorney, Agent, or Firm* — Seed IP Law Group PLLC (57) ABSTRACT

The disclosure relates to an electrically erasable and programmable memory, comprising memory cells arranged in bit lines and word lines transverse to bit lines, wherein each memory cell may be in a programmed or erased state, the memory comprising memory cell selection circuits configured to memorize and read data bits in two memory cells belonging to different bit lines and different word lines, and to avoid a memory cell from being written or read by mistake in another state than a default state after a gate oxide breakdown of a transistor of the memory, and a read circuit to determine a data bit to be read in the memory according to the states of the two memory cells memorizing the data bit.

20 Claims, 7 Drawing Sheets

EEPROM MEMORY PROTECTED AGAINST THE EFFECTS OF BREAKDOWN OF MOS TRANSISTORS

BACKGROUND

1. Technical Field

The present disclosure relates to electrically erasable and programmable memories.

The present disclosure more particularly relates to an electrically erasable and programmable memory, comprising memory cells arranged in bit lines and word lines.

2. Description of the Related Art

Figure 1:
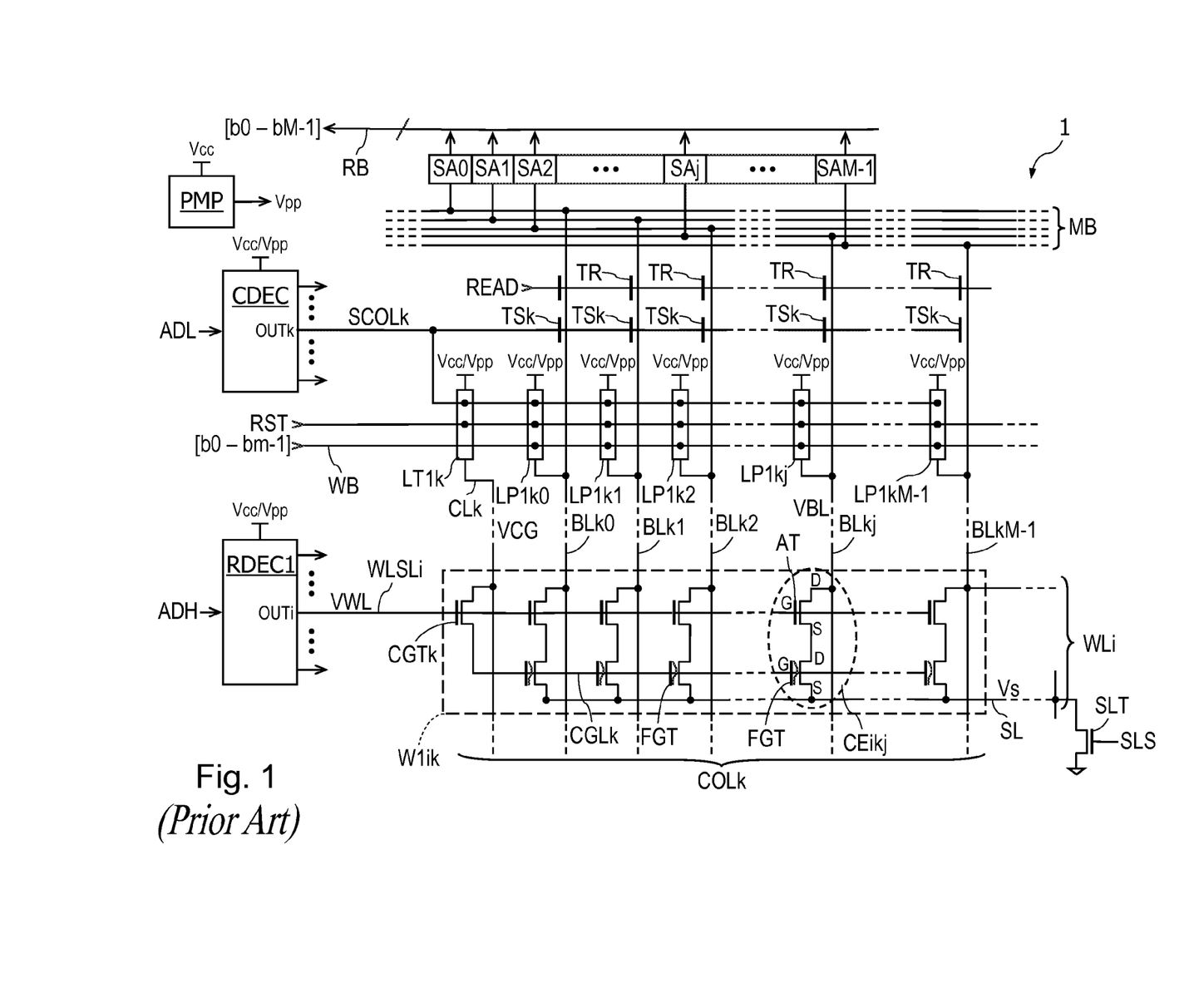
FIG. 1 previously described shows an example of architecture of conventional EEPROM memory, FIG. 2 schematically shows the organization of a memory array of an EEPROM memory, according to one embodiment, FIG. 3 schematically shows the organization of a memory array of an EEPROM memory, according to another embodiment.

FIG. 1 shows an example of EEPROM memory 1 of the aforementioned type. The memory comprises memory cells CEikj connected to word line selection lines WLSLi and bit lines BLkj transverse to the word lines. The bit lines are gathered into columns COLk comprising M bit lines BLk0, ... BLkj ..., BLkM-1. The memory cells connected to a same selection line WLSLi form a word line WLi. The memory cells of a same word line WLi connected to the M bit lines of a column COLk form a memory word W1ik allowing M bits to be stored. For the sake of simplicity, only one word W1ik belonging to a column COLk and a word line WLi is shown in FIG. 1.

Each memory cell CEikj comprises a floating gate transistor FGT and an access transistor AT of MOS type. The transistor AT comprises a gate terminal G connected to the line WLSLi, a drain terminal D connected to a bit line BLkj and a source terminal S connected to a drain terminal D of the transistor FGT. The transistor FGT comprises a control gate terminal G connected to a gate control line CGLk and a source terminal S connected to a source line SL. The line SL is connected to the ground through a transistor SLT driven by a signal SLS. The line CGLk is linked to a column selection line CLk through a gate control transistor CGTk having a gate terminal connected to the line WLSLi.

Each line WLSLi is controlled by a signal VWL supplied by an output OUTi of a line decoder RDEC1. Each line CLk is controlled by a gate control signal VCG supplied by a column latch LT1k. Each latch LT1k is controlled by a column selection signal SCOLk supplied by an output OUTk of a column decoder CDEC. The decoders RDEC1 and CDEC respectively receive the most significant bits ADH and the least significant bits ADL of the address of a word W1ik to be selected in the memory 1.

Each bit line BLkj is linked to a bit line latch LP1kj driven by the column selection signal SCOLk. Each latch LP1kj is connected to a bus WB to receive, before a program operation, a data bit bj among M bits b0 to bM-1 of a data word to be written. Each bit line BLkj is also linked to a sense amplifier SAj through a column selection transistor TSk, a read transistor TR and a multiplex bus MB. The transistors TSk are driven by the column selection signal SCOLk while the transistors TR are driven by a read signal READ. Sense amplifiers SA0 to SAM-1, connected in input to the bus MB and in output to a bus RB, allow the M bits of a word W1ik to be read.

In such a memory, an operation for erasing or programming memory cells consist in injecting or extracting electric charges by tunnel effect (Fowler Nordheim effect) in the floating gates of the transistors FGT. A transistor FGT has in the programmed state, a threshold voltage VTw, and in the erased state, a threshold voltage VTe. When a read voltage Vread comprised between VTw and VTe is applied to the control gate thereof, a transistor FGT in the programmed state is conductive, which corresponds by convention to a logic "1", and a transistor in the erased state is blocked, which corresponds by convention to a logic "0"; an inverse convention may be adopted.

Collectively erasing the transistors FGT of a word line WLi is made by applying a voltage Vpp of 15 to 20 V to the control gates of the transistors FGT, while the source line SL is at 0 and the bit lines BLkj are at a floating potential. Individually programming the transistors FGT is obtained by applying the voltage Vpp to the drains of the transistors FGT through the access transistors AT, while the control gates of the transistors FGT are at 0 and the source line SL is at a floating potential. These operations are made using the decoders RDEC1, CDEC, latches LT1k and LP1kj, by increasing the supply voltage of these elements, from Vcc of around 1.8 to 5.5 V, to the voltage Vpp. The voltage Vpp is generated by a charge pump PMP from the supply voltage Vcc of the memory.

Table 1 below sums up the values of the control signals during the operations for erasing, programming and reading a memory cell CEikj. In Table 1, Vs is a control signal present on the source line SL, VBL is a control signal present on the bit line BLkj and Vsense is a signal supplied by the sense amplifiers SAj.

TABLE 1

| | Operation | | |
| --- | --- | --- | --- |
| Control signals | ERASING | PROGRAMMING | READING |
| VCG | Vpp | 0 (ground) | Vread |
| VWL | Vpp | Vpp | Vcc |
| Vs | 0 (ground) | Floating | 0 (ground) |
| VBL | Floating | Vpp | Vsense |

Due to the application of the voltage Vpp to the gates or drains thereof, several transistors are subjected to a not negligible electrical stress during the successive erase/program cycles. They are in particular the access transistors AT, the floating gate transistors FGT, transistors in the column LT1k and line bit LP1kj latches, and transistors in the line decoder RDEC1.

The gate oxides of these transistors are chosen consequently, and are made to support voltages that may reach 30 V. However, gate oxides are not perfect and have several drawbacks or impurities susceptible of causing breakdown in normal use conditions. Thus, the breakdown of a transistor is sometimes observed far before the specified hundreds of erase/program cycles. Although there is little prospect of a transistor breakdown, the number of memory cells present in an EEPROM memory is high and, statistically, the failure rate of a memory due to a gate oxide breakdown is one of the main causes, even the main cause of failure of an EEPROM memory being used.

To compensate for this drawback, it is known, during the manufacturing tests, to apply to memories an electrical stress which may be greater than that to which a memory in normal use is subjected. These operations allow the memories having manufacturing defects or very insufficient robustness to be eliminated. However, these operations require several thousand program cycles to test all the transistors and therefore eliminate the memories having gate oxide defects. These operations prove to be insufficient since EEPROM memories are usually designed to support 1 million program cycles by byte, and that the failure rate of such a memory due to a gate oxide breakdown still reaches a ratio of around one memory out of 1 million (1 ppm).

It has also been suggested to associate to data bits stored in the memory an error correction code, or ECC code, allowing at least one erroneous bit to be detected and corrected in a bit string. For example, a 4-bit hamming code added to 8 bits of data allow an erroneous bit to be detected and corrected when reading the bit string. This precaution usually proves to be sufficient to correct the consequences of the breakdown of a floating gate transistor FGT, but is not effective to counter a failure of an access transistor AT. Indeed, it may be impossible to properly erase the memory cells of a word line WLi connected to a faulty access transistor AT, or to properly program memory cells of a bit line BLkj connected to a faulty access transistor.

The patent FR 2 826 496 (U.S. Pat. No. 6,934,192) describes adjustments of an EEPROM memory to avoid the breakdown effects of an access transistor during phases for erasing cells of a word line connected to a faulty access transistor, and during phases for programming cells of the bit line connected to the faulty access transistor.

The patent FR 2 858 725 (U.S. Pat. No. 7,239,192) describes a charge pump associated to a circuit allowing a failure to be detected in stages of the charge pump, the charge pump comprising a replacement stage provided to replace a corrupted stage. It is also provided to associate to each memory word an error correction code allowing some cases of bit reading errors to be corrected.

However, these solutions do not allow the effects of transistor gate oxide breakdown to be avoided in an EEPROM memory, if the faulty transistor is located in a bit line or column latch, or in the word line decoder. More generally, these solutions do not make it possible, in all the aforementioned cases, to detect that a bit stored in the memory is erroneous due to a gate oxide breakdown, nor to correct the value of an erroneous bit. Indeed, if the breakdown of a gate oxide concerns for example a transistor of the line decoder, all the memory cells of a word line may be faulty. The result is that the provision of an error correction code memorized in memory cells of the same word line is ineffective.

In some equipment comprising EEPROM memories, like vehicle-borne equipment, the failure rate must be very low. It is therefore desirable to reduce the failure rate of EEPROM memories resulting from transistor gate oxide breakdowns.

BRIEF SUMMARY

Thus, in one embodiment, an electrically erasable and programmable memory is provided, comprising memory cells arranged in bit lines and word lines transverse to bit lines, wherein each memory cell may be in a programmed or erased state. According to one embodiment, the memory comprises circuits for selecting and accessing memory cells configured to memorize and read a data bit in two memory cells belonging to different bit lines and different word lines, and to avoid a memory cell from being written or read by mistake in another state than a default state after a gate oxide breakdown of a transistor of the memory, and a read circuit to determine a data bit to be read in the memory according to the states of the two memory cells memorizing the data bit.

According to one embodiment, the read circuit is configured so that the state of a not erroneous memory cell is, for the read circuit, predominant over the default state of erroneous memory cell.

According to one embodiment, the memory cells are gathered into word locations, each word location may be selected by a word column decoder and a word line decoder, a word of data being memorized in the memory in two word locations belonging to different word lines and different word columns.

According to one embodiment, the default state of erroneous memory cell is the erased state, the read circuit comprising an OR logic gate supplying a data bit memorized in memory, according to the states of the two memory cells memorizing the data bit.

According to one embodiment, the default state of erroneous memory cell is the erased state, each memory cell comprising a floating gate transistor and an access transistor connected to a terminal of the floating gate transistor, the memory comprising circuits to generate a read voltage for reading memory cells chosen nearer a threshold voltage of floating gate transistor in the programmed state than a threshold voltage of floating gate transistor in the erased state, in order to favor the erased state when reading a memory cell.

According to one embodiment, the default state is the programmed state, the read circuit comprising an AND logic gate supplying a bit memorized in memory, according to the states of the two memory cells memorizing the data bit.

According to one embodiment, the memory comprises bit line latches, column latches and word line latches to control erasing, programming and reading memory cells, which are configured so that a selected memory cell is read in the default state in the event of transistor gate oxide breakdown.

According to one embodiment, each memory cell comprises a floating gate transistor and an access transistor connected to a terminal of the floating gate transistor, the memory comprising a word line selection circuit to apply a first signal to the gate of the access transistor of cells of a selected word line, and a second signal to the gate of a gate control transistor of a selected word, the second signal being different from the first signal.

According to one embodiment, the memory comprises bit line latches, column latches and word line latches to control erasing, programming and reading memory cells, the column latches and word line latches comprising redundant circuits to be able to generate erase or program signals making it possible to perform erasing a memory cell to be erased, and preventing a memory cell from being programmed by mistake, in the event of transistor gate oxide breakdown.

In one embodiment, a method for accessing a data bit in an electrically erasable and programmable memory is provided, comprising memory cells arranged in bit lines and word lines transverse to bit lines, wherein each memory cell may be in a programmed or erased state. According to one embodiment, the method comprises selecting two different bit lines and two different word lines to select two memory cells, reading the data bit comprising reading the states of the two selected memory cells, and determining the value of the data bit according to the states of the two selected memory cells, accessing a memory cell being performed avoiding a memory cell from being written or read by mistake in another state than a default state after a gate oxide breakdown of a transistor of the memory.

According to one embodiment, during the determination of the value of the data bit, the state of a not erroneous memory cell is predominant over the default state of erroneous memory cell.

According to one embodiment, the memory cells are gathered into word locations, each may be selected by a word column decoder and a word line decoder, the method comprising selecting two different word columns and two different word lines to access two different word locations, each memorizing a same data word.

According to one embodiment, the default state of erroneous memory cell is the erased state, the determination of the value of the data bit being performed by applying an OR logic function to the states of the two selected memory cells.

According to one embodiment, the default state of erroneous memory cell is the erased state, each memory cell comprising a floating gate transistor and an access transistor connected to a terminal of the floating gate transistor, the method comprising generating a read voltage for reading memory cells chosen nearer a threshold voltage of the floating gate transistor in the programmed state than a threshold voltage of the floating gate transistor in the erased state, in order to favor the erased state when reading a memory cell.

According to one embodiment, the default state is the programmed state, the determination of the value of the data bit being performed by applying an AND logic function to the states of the two selected memory cells.

According to one embodiment, each memory cell comprises a floating gate transistor and an access transistor connected to a terminal of the floating gate transistor, the method comprising applying a first signal to the gate of the access transistor of cells of a selected word line, and a second signal to the gate of a gate control transistor of a selected word, the second signal being different from the first signal.

BRIEF DESCRIPTION OF THE SEVERAL VIEWS OF THE DRAWINGS

Embodiments of the disclosure will be described hereinafter, in relation with, but not limited to the appended figures wherein.

DETAILED DESCRIPTION

Figure 2:
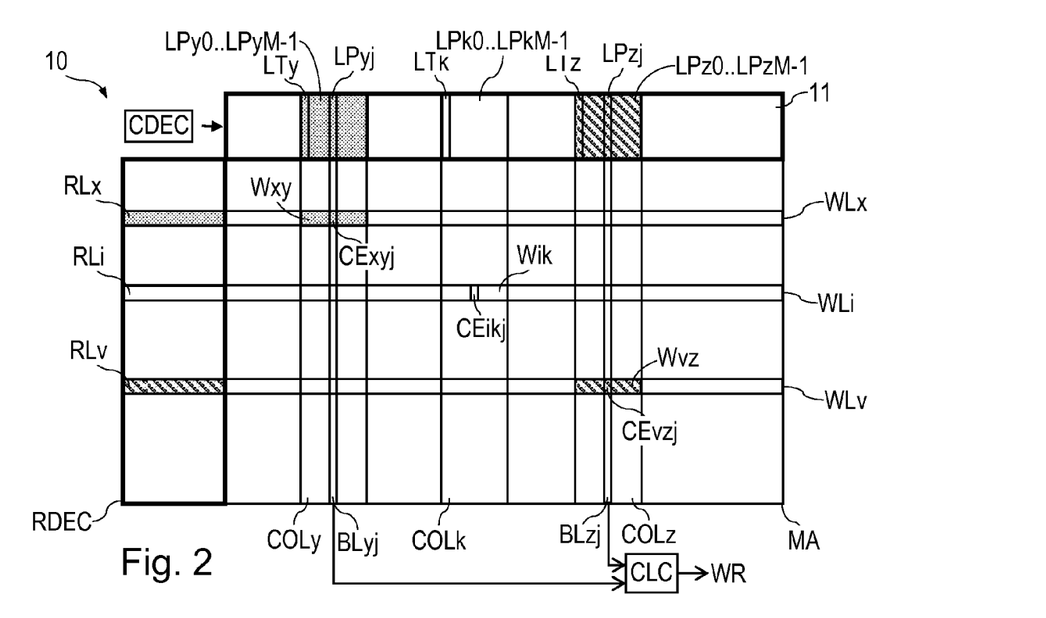

FIG. 2 shows the architecture of an EEPROM memory 10 according to one embodiment. The memory 10 comprises a memory array MA in which memory cells CEikj are formed. The memory cells are gathered in words Wik of M memory cells, each word belonging to a word column COLk and a word line WLx transverse to the word column. The memory comprises a line decoder RDEC, a column decoder CDEC, and for each word column a column latch LTk and bit line latches LPk0 ... LPkM-1, controlled by the decoder CDEC according to a read or write address supplied to the memory. The latches LPkj allow each memory cell CEikj of a selected word Wik to be selectively controlled. The decoder RDEC comprises word line latches RLi which are controlled according to an access address supplied to the memory.

In one embodiment, the decoder RDEC is configured to sequentially select and activate two word line latches RLx, RLv in order to select two word lines WLx, WLv according to an access address supplied to the memory 10. Likewise, the decoder CDEC is configured to sequentially activate two column latches LTy, LTz according to the access address, in order to select two columns COLy, COLz, and if need be, activate bit line latches LPy0 ... LPyM-1, LPz0 ... LPzM-1 of each selected column, so as to select memory cells CExyj, CEvzj in each selected word. Thus, a data word stored in the memory is memorized in two locations of memory words Wxy, Wvz located in the memory array MA in two different word lines WLx, WLv and two different columns COLy, COLz. The operations of erasing, programming and reading the memory are therefore performed by sequentially accessing two locations of memory words in the memory array, selected according to an address for accessing the memory. To that end, the line decoder RDEC and the column decoder CDEC are configured to select two word lines and two columns according to an access address supplied to the memory. The value of each bit of a data word read in the memory is obtained by a logic circuit CLC combining the states of the two memory cells CExyj, CEvzj memorizing the data bit, in the two locations of memory word Wxy, Wvz selected in the memory array MA.

In addition, the memory, and in particular the memory array MA, the column LTk, bit line LPk0 ... LPkM-1 and word line RLi latches are configured to avoid a memory cell from being written or read by mistake in a state other than a default state after a gate oxide breakdown of a transistor of the cell or a selection or access circuit of the memory. In other words, the memory is configured to ensure that a write command in the default state of memory cells is always executed, and that a write command in a state other than the default state or a read command does not reach memory cells which may be selected by mistake.

The combination logic circuit CLC may then be configured so that the programmed or erased state of a not faulty memory cell is predominant over the default state of a faulty cell. Thus, if the default state is the erased state, the circuit CLC may be configured to determine the value of a data bit stored in the memory by applying an OR logic function to the state of two memory cells memorizing a same data bit. If the default state is the programmed state, the circuit CLC may be configured to determine the value of a data bit stored in the memory by applying an AND logic function to the state of two memory cells memorizing a same data bit.

Figure 3:
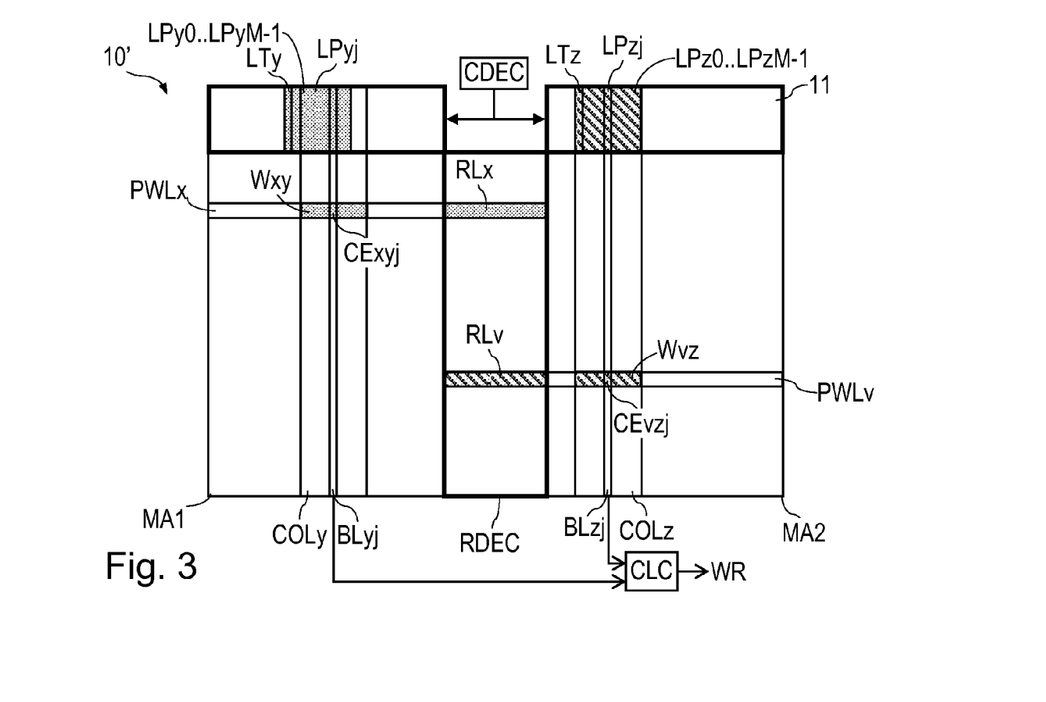

FIG. 3 shows the architecture of an EEPROM memory 10' according to another embodiment. The memory 10' differs from the memory 10 in that the bit lines are distributed among two memory arrays MA1, MA2, the word lines being divided into two parts, each belonging to one of the memory arrays MA1, MA2. The line decoder RDEC is configured to simultaneously activate, according to an address supplied to the memory, only one part of word line PWLx belonging to a memory array MA1, and another part of another word line PWLv belonging to the other memory array MA2. The column decoder CDEC is configured to simultaneously activate, according to the address supplied to the memory, one column of bit lines COLy belonging to a memory array MA1, and one column of bit lines COLz belonging to the other memory array MA2. Two locations of memory word Wxy, Wvz are thus simultaneously selected according to an address supplied to the memory during a program, erase or read access, both locations being located in different memory arrays MA1, MA2 and two different word lines WLx, WLv. The circuit CLC may then simultaneously receive the states of the memory cells of both locations of read words and combine them two by two to determine the value of a word stored in memory.

It is to be noted that it may be provided that the memory comprises a different line decoder for each memory array, which are simultaneously activated to access two locations of memory word in which a same word is stored.

Figure 4:
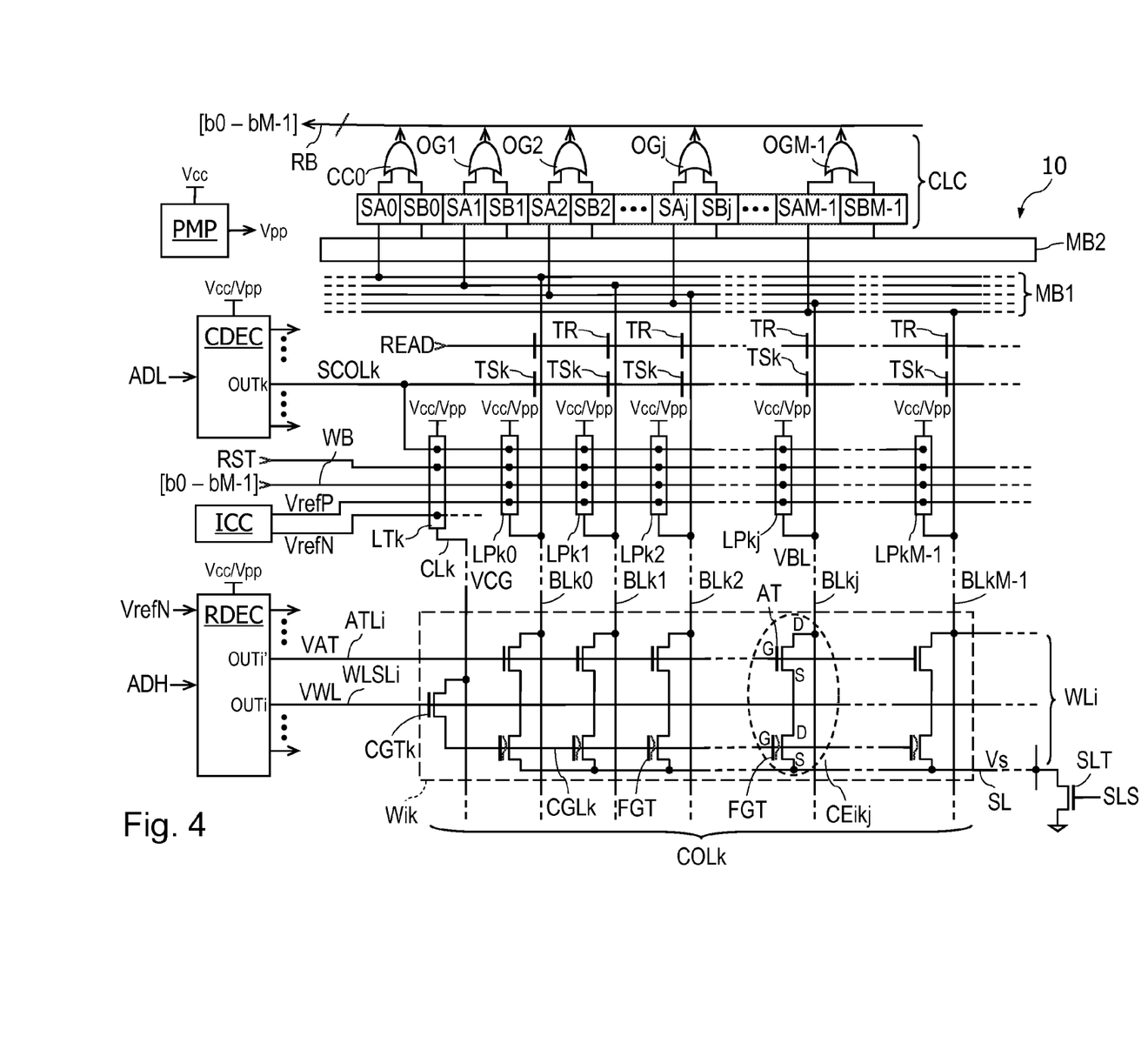
FIG. 4 shows an example of architecture of an EEPROM memory, according to one embodiment.

FIG. 4 shows an EEPROM memory 10 according to one embodiment. The memory comprises memory cells CEikj connected to word line selection lines WLSLi and bit lines BLj. The bit lines are gathered into columns COLk comprising M bit lines BLk0, ... BLkj ..., BLkM-1. The memory cells connected to a same selection line WLSLi form a word line WLi. The memory cells of a same word line WLi connected to the M bit lines of a column COLk form a memory word Wik of M memory cells. For the sake of simplicity, only one word Wik belonging to a column COLk and a word line WLi is shown in FIG. 4.

Each memory cell CEikj comprises a floating gate transistor FGT and an access transistor AT of MOS type. The transistor AT comprises a gate terminal G, a drain terminal D connected to a bit line BLkj and a source terminal S connected to the drain D of the transistor FGT. The transistor FGT comprises a control gate terminal G connected to a gate control line CGLk and a source terminal S connected to a source line SL. The line SL is connected to the ground through a transistor SLT driven by a signal SLS. The line CGLk is linked to a column selection line CLk through a gate control transistor CGTk having a gate terminal connected to the line WLSLi.

Each line CLk is controlled by a gate control signal VCG supplied by a column latch LTk. Each latch LTk is controlled by a column selection signal SCOLk supplied by an output OUTk of the column decoder CDEC. The decoders RDEC and CDEC respectively receive the most significant bits ADH and the least significant bits ADL of the address of a word Wik to be selected in the memory.

Each bit line BLkj is linked to a program latch LPkj driven by a column selection signal SCOLk. Each latch LPkj is connected to a bus WB to receive, before a program operation, a data bit bj among M bits b0 to bM-1 of a word to be written in the memory. Each bit line BLkj is also linked to a sense amplifier SAj through a column selection transistor TSk, a read transistor TR and a multiplex bus MB1. The transistors TSk are driven by the column selection signal SCOLk, while the transistors TR are driven by a read signal READ. Sense amplifiers SA0 to SAM-1, which have respective inputs connected to the bus MB1 and respective outputs linked to a bus RB, allow the M bits of a word Wik to be read. The latches LTk and LPkj also receive a reset signal RST.

According to one embodiment, the memory 10 comprises a second set of sense amplifiers SB0 to SBM-1 to read a second word in the memory. The amplifiers SB0 ... SBM-1 are connected at the input to a second bus MB2, and at the output to an input of a respective logic circuit OG0 ... OGM-1 which output is connected to the bus RB. Another input of each circuit OGj is connected to a respective amplifier SAj. The bus MB2 is also linked to the bit lines BLkj through read transistors TR driven by the signal READ and column selection transistors driven by a column selection signal supplied by the decoder CDEC. When an address ADL is supplied thereto, the decoder CDEC activates two signals SCOLk to select two columns. In the embodiment shown in FIG. 4, the state of the preferred memory cell by default is the erased state. The logic circuits OGj are therefore OR logic gates. If at least one out of two memory cells read, connected to a same gate OGj is in the programmed state (at 1), it means that this memory cell is not defective and therefore that the data bit read is at 1. If the two memory cells read, connected to a same gate OGj are in the erased state (at 0), none, one or both memory cells may be defective. If none or one of the two memory cells is defective, the value of the bit supplied by the gate OGj is properly evaluated at 0. If both memory cells are defective, which may occur with a very low probability, the value of the bit supplied by the gate OGj is erroneous.

According to one embodiment, the gate of the access transistor AT of each memory cell CEikj is not connected to a word line selection line WLSLi like in the example of FIG. 1, but to a special line ATLi, provided for controlling the gates of the access transistors AT of the word line WLi to which the cell belongs. The selection line WLSLi of each word line WLi is only connected to the gate control transistor CGTk of the word Wik, as well as to the gate control transistors of the other words belonging to the word line WLi (not shown).

Each selection line WLSLi is connected to an output OUTi of the line decoder RDEC conventionally supplying a word line selection signal VWL. The decoder RDEC comprises for each line WLi a second output OUTi' which is connected to the line ATLi and which supplies a signal VAT performing controlling the gates of the access transistors AT belonging to the line WLi. The signal VAT is identical to the signal VWL during program or read phases, and the memory 10 thus conventionally operates while programming and reading. However, during erase phases, the signal VAT is brought to a voltage equal to that of the signal VS on the source of the floating gate transistors FGT, i.e., here a null voltage.

That way, if an access transistor AT of a cell CEikj is defective, the other cells of the same word Wik may be erased.

Table 2 below sums up the values of the control signals during the operations for erasing, programming and reading the memory 10. As previously, the control signal present on the bit line BLkj is referred to as VBL. The supply voltage Vcc of the memory is around 1.8 to 5.5 V, the voltage Vpp around 15 to 20 V, the voltage supplied by the sense amplifiers SAj, SBj is referred to as Vsense. Vread refers to the read voltage which is applied to the control gate of the transistor FGT of the memory cells to be read. The voltage Vread is comprised between the threshold voltages in the programmed state VTw and in the erased state VTe.

TABLE 2

| Control signals | Operation | | |
|---|---|---|---|
| | ERASING | PROGRAMMING | READING |
| VCG | Vpp | 0 (ground) | Vread |
| VWL | Vpp | Vpp (or Vcc) | Vcc |
| VAT | 0 (ground) | Vpp | Vcc |
| Vs | 0 (ground) | Floating | 0 (ground) |
| VBL | Floating | Vpp | Vsense |

During a phase for erasing a memory cell, the gate and channel of the access transistor AT of the memory cell are at a null voltage. During a program phase, the gate of the transistor VAT receives the signal VAT at the voltage Vpp and the drain thereof receives the signal VBL at a voltage equal to Vpp-Vt, where Vt is a threshold voltage of a transistor of MOSN type of the corresponding latch LPkj. The gate oxide breakdown of the transistor VAT would therefore have the effect to bring the signal VBL to the voltage Vpp. The result is therefore that there is neither short-circuit between the voltage Vpp and the ground, nor over consumption. The possible failure of an access transistor remains confined to the memory cell comprising the faulty access transistor, without contaminating the other cells of the word line, in terms of erasability of the cells. When reading a memory cell, the gate oxide breakdown of the access transistor AT of the memory cell causes a short-circuit between the gate and the channel thereof, which tends to bring the potential of the bit line to the potential of the signal VAT. The result is that the sense amplifier connected to the bit line is going to consider that the memory cell is in the erased state, whatever the actual state of the memory cell.

During the program phase, the word line structure allows either the voltage Vpp or voltage Vcc to be applied to the word line selection line WLSLi (signal VWL), in order to turn ON the gate control transistor CGTk and connect the control gates of the transistors FGT to the ground (signal VCG=0). The voltage of the signal VWL may therefore be chosen different from that of the signal VAT during the program phase. The advantage of controlling gate control transistors CGT with the voltage Vcc during the program phase is to limit the electrical stress to which the transistors are subjected.

Although it has been suggested above to apply a null voltage to the gates of the access transistors AT during erase phases, the signal VAT may admittedly be brought to a floating potential, or to another value if the voltage VS applied to the sources of the floating gate transistors is different from 0. For example, some erase methods use a negative source voltage. The signal VAT may be in this case at a negative voltage during the erase phases.

Figure 5:
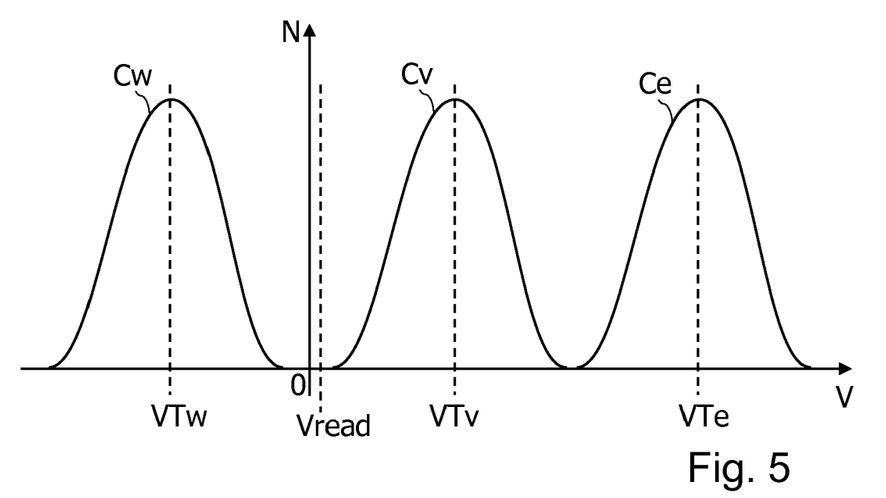
FIG. 5 shows distribution curves of threshold voltages of floating gate transistors in a memory, according to the states thereof, blank, programmed and erased.

According to one embodiment, the read voltage Vread supplied by the column latch LTk of a word to be read is chosen in order to favor the erased state of memory cells. FIG. 5 shows in the form of histogram curves Cw, Cv, Ce, the distribution, as a function of the number of transistors, of the threshold voltages of the floating gate transistors FGT of an EEPROM memory, respectively in the programmed, blank and erased state. The curves Cw, Cv and Ce have the shape of Gauss curves centered on the average threshold voltages of a floating gate transistor FGT, respectively in the programmed VTw, blank VTv and erased VTe state. Conventionally, the voltage Vread is chosen substantially equal to the average of threshold voltages VTw and VTe, i.e., substantially centered on the threshold voltage in the blank state VTv. To favor the erased state, the read voltage Vread is chosen nearer the threshold voltage VTw than the threshold voltage VTe. Typically, the threshold voltages VTw, VTv and VTe are respectively near −1 V, 1 V and 3 V. The voltage Vread is conventionally chosen near the threshold voltage VTv to guarantee better data retention and because the voltage VTv substantially corresponds to the average value of the threshold voltages VTw and VTe. To favor the erased state, the voltage Vread is chosen in an intermediate area between the curves Cw and Cv where they have values around 0. Thus, the voltage Vread may be chosen near 0 V. That way, a blank cell is always read as erased. In addition, if a floating gate transistor FGT of a memory cell is faulty, the result of the reading may be forced to the erased state.

Admittedly, it may be provided to choose that the programmed state is the default state when reading a faulty memory cell, and to favor the programmed state in reading. In that case, the read voltage Vread is chosen nearer the threshold voltage VTe of a transistor FGT in the erased state.

According to one embodiment, each bit line latch LPkj, each column latch LTk and the decoder RDEC are controlled in current by a current control circuit ICC, so as to supply in a bit line BLkj, a line CLk, a line VAT and a line VWL a current that may not exceed a maximum value. This maximum current value is calculated so that the sum of the supplied currents does not exceed the maximum current that may be supplied by the supply voltage Vpp, i.e., the charge pump PMP.

Figure 6:
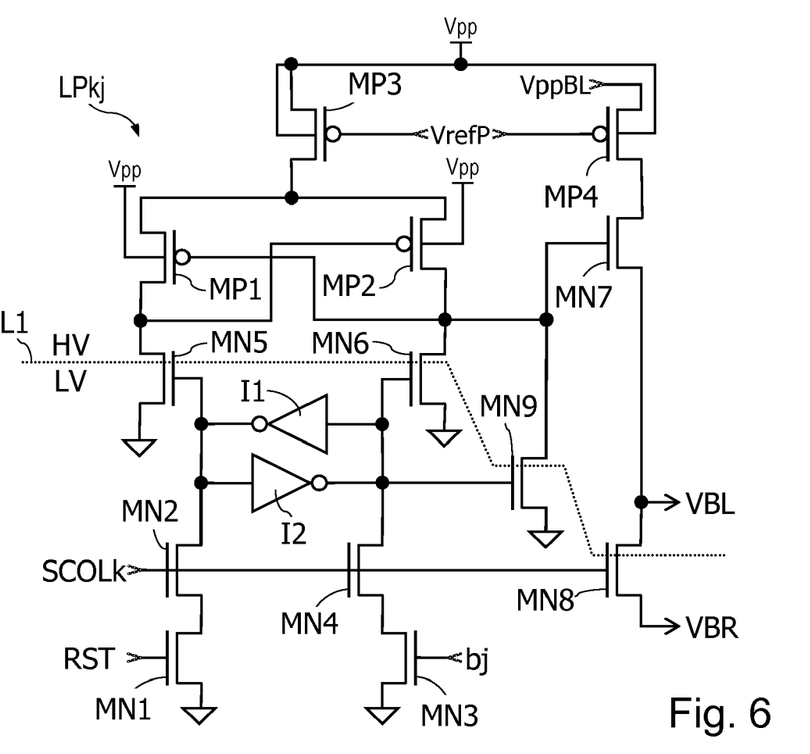
FIG. 6 is a diagram of a circuit of a bit line latch, according to one embodiment.

FIG. 6 shows a bit line latch circuit LPkj. The latch LPkj conventionally comprises two PMOS transistors MP1, MP2 receiving on the sources thereof the voltage Vpp. The gate of the transistor MP1 is connected to the drain of the transistor MP2 and vice versa, the gate of the transistor MP2 is connected to the drain of the transistor MP1. The drain of the transistor MP1 is also connected to the drain of an NMOS transistor MN5, and the source of the transistor MP2 is connected to the drain of an NMOS transistor MN6. The sources of the transistors MN5 and MN6 are connected to the ground. The gates of the transistors MN5 and MN6 are connected to two inverting gates I1, I2 mounted back-to-back and forming a latch. The gate of the transistor MN5 is also connected to the drain of an NMOS transistor MN2 connected in series with an NMOS transistor MN1 which source is connected to the ground. The gate of the transistor MN2 receives the signal SCOLk, and the gate of the transistor MN1 receives the signal RST. The gate of the transistor MN6 is also connected to the drain of an NMOS transistor MN4 connected in series with an NMOS transistor MN3 which source is connected to the ground. The gate of the transistor MN4 receives the signal SCOLk and the gate of the transistor MN3 receives one of the data bj of a word to be written. Each latch LPkj also comprises an NMOS transistor MN7 receiving on the drain thereof a signal VppBL and which gate is connected to the drains of the transistors MP2 and MN6. The source of the transistor MN7 is connected to the drain of an NMOS transistor MN8, and supplies the signal VBL to the corresponding bit line BLkj. The gate of the transistor MN8 receives the signal SCOLk and the source of this transistor supplies a signal VBR which is sent to one of the buses MB1 or MB2. The signal VppBL is at 0 during an operation for erasing cells of the memory and at the voltage Vpp during a write operation.

A line L1 shown in dotted line in FIG. 6 delineates an area of the circuit susceptible of being subjected to a high voltage HV near the voltage Vpp, and an area subjected to a lower voltage LV, located below this line. The transistors MP1 to MP4 and MN7, and the drains of the transistors MN5, MN6 and MN8 are located in the area subjected to the high voltage. The transistors exposed to the risk of gate oxide breakdown are those which terminals may be subjected to high potential differences. The transistors MP3 and MP4 are only subjected to a voltage difference between the terminals thereof around the threshold voltage of a MOS transistor. The transistors MP1 and MP2 may have the gates or the drains thereof at 0 V, and the transistor MN7 may also have the gate thereof at 0 V. The result is that only the transistors MP1, MP2, MN5, MN6, MN7 and MN8 are exposed to the risk of gate oxide breakdown.

According to one embodiment, each bit line latch LPkj comprises a PMOS transistor MP3 which transmits the voltage Vpp to the sources of the transistors MP1 and MP2, and a PMOS transistor MP4 which transmits the signal VppBL to the drain of the transistor MN7, the substrates of the transistors MP1, MP2, MP3 and MP4 being at the voltage Vpp. The gates of the transistors MP3 and MP4 receive a reference voltage VrefP. The voltage VrefP is chosen so as to limit the maximum current going through the transistors MP1 and MP2 to a value around 1 µA. To that end, the voltage VrefP is chosen so that the voltage (Vpp VrefP) is slightly higher in absolute value than the threshold voltage of the transistors MP1 and MP2. Each bit line latch LPkj comprises an NMOS transistor MN9 which drain is connected to the gate of the transistor MN7 and the drains of the transistors MP2 and MN6, which gate is connected to the drain of the transistor MN4, and which source is connected to the ground. The transistors MP3 and MP4 and the drain of the transistor MN9 are located in the area subjected to a high voltage (above the line L1 in FIG. 6).

Each latch LPkj thus comprises a low voltage latch formed by the two inverting gates I1, I2 and a lever shifter formed by the transistors MP1, MP2, MN5 and MN6. If the low voltage latch is raised during a program phase, the signal VBL is at the program voltage, i.e., Vpp. If the latch is lowered, the signal VBL is at a floating potential.

The transistors MP3 and MP4 are biased to perform a current limitation function. They thus allow a drop in the voltages Vpp and VppBL to be avoided in the event of a failure of the transistor MP1 or MP2 or a failure of the transistor MN7, thus preventing the absolute value of the threshold voltage VTw or VTe from decreasing. Typically, the intensity of the signals supplied by the transistors MP3 and MP4, and therefore the intensity of the signal VBL is limited to a value around 1 µA.

The latch circuit LPkj which has just been described makes it possible to guarantee that a command for erasing a memory cell is performed even if one or more transistors MP1, MP2, MN5, MN6, MN7 and MN8 has been subjected to a gate oxide breakdown, the state chosen by default of memory cell being the erased state. To that end, the latch LPkj may not be raised if it was in the lowered state. Indeed, so that the latch appears in the raised state while it was in the lowered state, the gate potential of the transistor MN7 should increase to the voltage Vcc. For this, a current should pass through the transistor MP3, which is limited to 1 µA. Now, when the latch is in the lowered state, the output of the gate I2 is necessarily at the voltage Vcc. Consequently, the transistor MN9 is in the conductive state and pulls the gate of the transistor MN7 to the ground. A transistor breakdown may result in a conflict between the transistor MN9 and the 1 µA current supplied by the transistor MP3. If the transistor MN9 is sized to supply a current far superior to 1 µA, it forces the gate voltage of the transistor MN7 to 0 in the event of a breakdown.

In addition, a breakdown of the transistor MN7 becoming conductive is not likely to increase the voltage of the signal VBL. Indeed, for the voltage of the signal VBL to increase, the gate of the transistor MN7 should be in short-circuit with the drain thereof. If this is the case, the gate potential of the transistor MN7 increases tending to the voltage Vpp with a current limited to 1 µA by the transistor MP4. If the latch is in the lowered state, the transistor MN9 strongly pulls the gate of the transistor MN7 to a null potential and therefore imposes its voltage against a possible accidental pulling of the gate potential of the transistor MP4 to the voltage Vpp. The result is that the failure of a latch LPkj has an effect only in program phase during which it may prevent a memory cell from being programmed, the memory cell therefore remains in the erased state.

The latch circuit Pkj which has just been described also makes it possible to guarantee that in the event of a gate oxide breakdown of one or more of the transistors thereof, it consumes a maximum current limited to a low value inferior to 2 µA. Indeed, this condition is verified because the two branches of the circuit receiving the voltage Vpp are limited to a 1 µA current by the transistor MP3 or MP4. In the worst case, corresponding to a transistor breakdown in both branches, the maximum current consumed is limited to 2 µA.

Figure 7A:
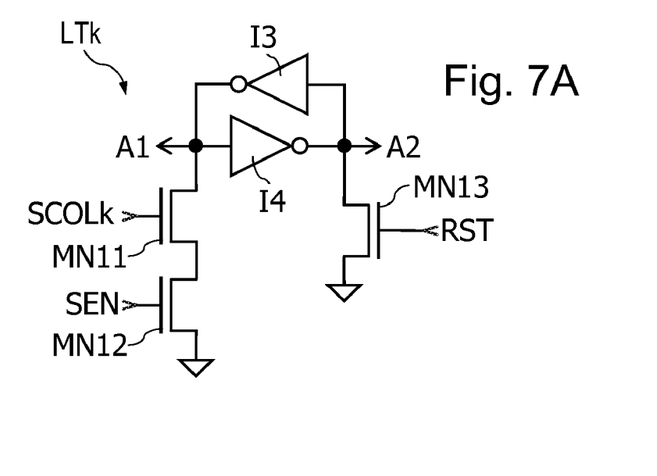
FIGS. 7A to 7C are diagrams of circuits of a column latch, according to one embodiment.
Figure 7B:
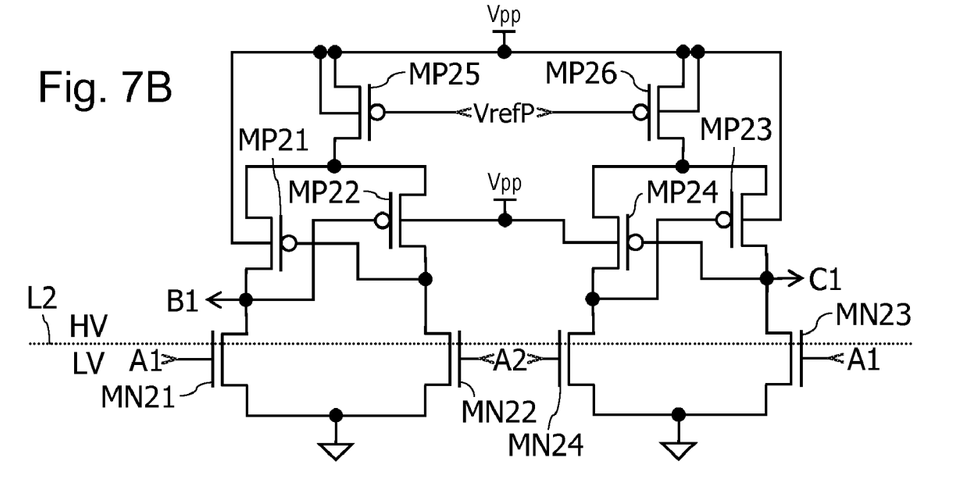
Figure 7C:
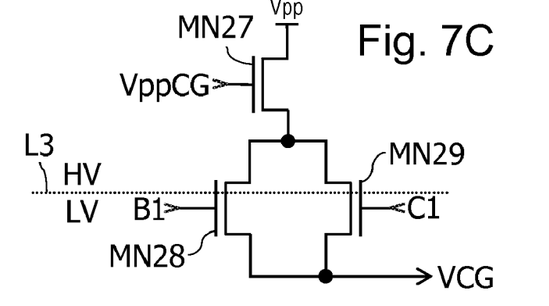

FIGS. 7A to 7C show circuits of a column latch LTk. In FIG. 7A, each latch LTk comprises two inverting gates I3, I4 mounted back-to-back, forming a low voltage latch. The terminals of the inverting gates I3, I4 supply signals A1 and A2. The signal A1 is supplied to the drain of an NMOS transistor MN11 connected in series to an NMOS transistor MN12 which source is connected to the ground. The gate of the transistor MN11 receives the signal SCOLk, and the gate of the transistor MN12 receives a decoding validation signal SEN. The signal A2 is applied to the drain of an NMOS transistor MN13 which gate receives the signal RST and which source is connected to the ground.

In FIG. 7B, each line latch LTk comprises six PMOS transistors MP21, MP22, MP23, MP24, MP25 and MP26, and four NMOS transistors MN21, MN22, MN23 and MN24. The sources of the transistors MP25 and MP26, as well as the substrates of the transistors MP21 to MP26 receive the voltage Vpp. The gates of the transistors MP25 and MP26 receive the reference voltage VrefP. The sources of the transistors MP21 and MP22 are connected to the drain of the transistor MP25. The sources of the transistors MP23 and MP24 are connected to the drain of the transistor MP26. The gate of the transistor MP21 is connected to the drain of the transistor MP22, and vice versa, the gate of the transistor MP22 is connected to the drain of the transistor MP21. Likewise, the gate of the transistor MP23 is connected to the drain of the transistor MP24, and vice versa, the gate of the transistor MP24 is connected to the drain of the transistor MP23.

The drain of the transistor MP21 which supplies a signal B1, is connected to the drain of the transistor MN21 which gate receives the signal A1 and which source is connected to the ground. The drain of the transistor MP22 is connected to the drain of the transistor MN22 which gate receives the signal A2 and which source is connected to the ground. Likewise, the drain of the transistor MP23 which supplies a signal C1, is connected to the drain of the transistor MN23 which gate receives the signal A1 and which source is connected to the ground. The drain of the transistor MP24 is connected to the drain of the transistor MN24 which gate receives the signal A2 and which source is connected to the ground.

The value of the voltage VrefP chosen also allows the maximum current going through the transistors MP21 to MP24 to be limited to a value around 1 µA.

In FIG. 7C, each latch LTk comprises three NMOS transistors MN27, MN28 and MN29. The drain of the transistor MN27 receives the voltage Vpp, and the gate of this transistor receives a signal VppCG. The source of the transistor MN27 is connected to the drains of the transistors MN28 and MN29 which sources supply the signal VCG. The gate of the transistor MN28 receives the signal B1 and the gate of the transistor MN29 receives the signal C1. The signal VppCG is at the voltage Vpp during the phases for erasing memory cells and at 0 (the ground) during the phases for programming memory cells.

FIGS. 7B and 7C shown in dotted line a line L2, L3 delineating areas of the circuit susceptible of being subjected to a high voltage HV near the voltage Vpp, and areas subjected to a lower voltage LV, the whole circuit of FIG. 7A not being susceptible of being subjected to the high voltage HV. The lines L2 and L3 show that only the transistors MP21 to MP26 and MN27 as well as the drains of the transistors MN21 to MN24, MN28 and MN29 are susceptible of being subjected to the high voltage HV. For reasons similar to those exposed above with reference to FIG. 6, only the transistors MP21 to MP24, MN21 to MN24, MN28 and MN29 are exposed to a risk of gate oxide breakdown.

If the low voltage latch formed by the two inverters I3, I4 is raised (at 1), the signal VCG at the output of the latch RLi is at the voltage Vpp during a phase for erasing the corresponding memory cells. On the other hand, if the latch is lowered (at 0), the signal VCG is brought to a floating potential. The transistors MP25 and MP26 are biased to perform a current limitation function. They thus allow a drop in the voltages Vpp and VppBL to be prevented in the event of a failure of one of the transistors MP21 to MP24 or one of the transistors MN21 to MN24, thus preventing the absolute value of the threshold voltages VTw or VTe from decreasing. Typically, the intensity of the signals supplied by the transistors MP25 and MP26, and therefore the intensity of the signals B1 and C1 is limited to a value around 1 µA.

In addition, the circuit of FIG. 7B comprises two redundant voltage lever shifters respectively supplying the signals B1 and C1 to the input of the circuit of FIG. 7C. Thus, if one of the two voltage lever shifters is faulty due to the failure of one of the transistors MP21, MP22, MN21, MN22 of the first circuit, or one of the transistors MP23, MP24, MN23, MN24 of the second circuit, one of the signals B1 or C1 is still present. The circuit of FIG. 7C performs the function of an OR logic gate receiving at the input the signals B1 and C1 and supplying at the output the signal VCG.

That way, the latch of LTk which has just been described makes it possible to guarantee that a command for erasing memory cells is executed even if one of the high voltage transistors of the latch has been subjected to a gate oxide breakdown, the state chosen by default of memory cell being the erased state. To that end, the latch of LTk guarantees that the following conditions are achieved in the event of a failure of a high voltage transistor. If the latch I1, I2 is lowered, it may remain lowered or be raised due to the faulty transistor. If it is raised, it may not pass by mistake to the not raised state. Indeed, the signals B1 and C1 supplied by the two redundant lever shifters (FIG. 7B) are identical in the absence of a high voltage transistor breakdown. The latch positioning corresponds to one of the signals B1 and C1 brought to the voltage Vpp. In the event of a transistor breakdown in one of the two lever shifters, one of the signals B1 or C1 is no longer valid, i.e., one of these signals remains at the voltage Vpp and the other is in an undetermined state. Thanks to the OR logic function performed by the circuit of FIG. 7C, the signal VCG will still be able to pass to the voltage Vpp to perform erasing memory cells. The result is that the failure of a latch LTk has an effect only in program phase during which it may prevent a memory cell from being programmed.

Figure 8A:
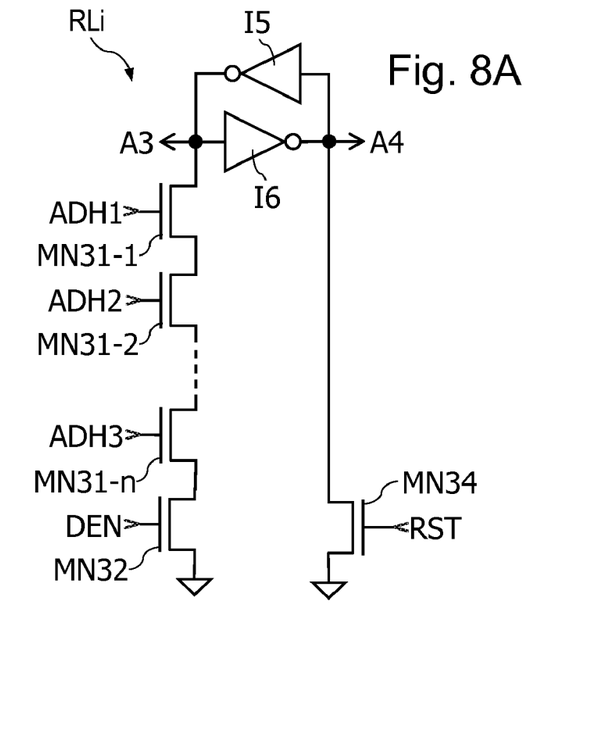
FIGS. 8A to 8C are diagrams of circuits of the word line decoder, according to one embodiment.
Figure 8B:
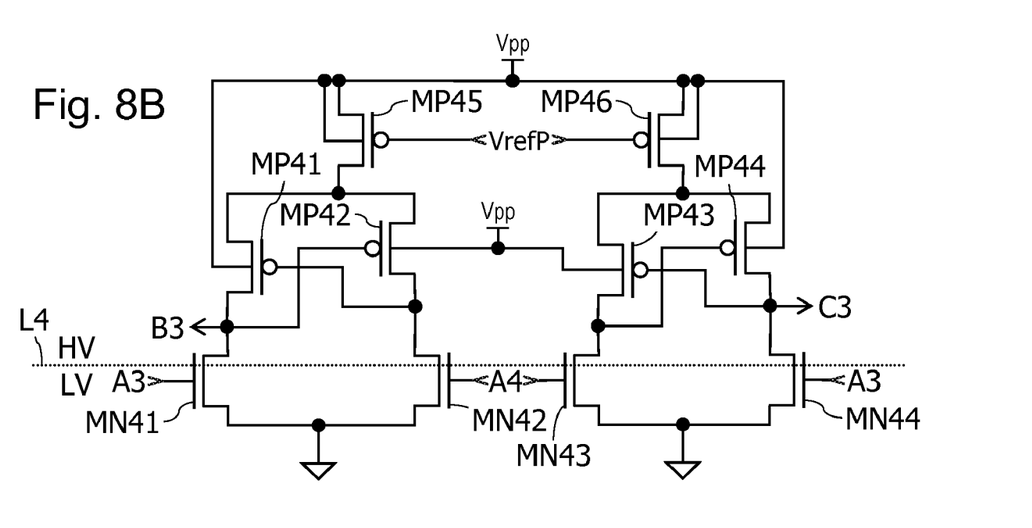
Figure 8C:
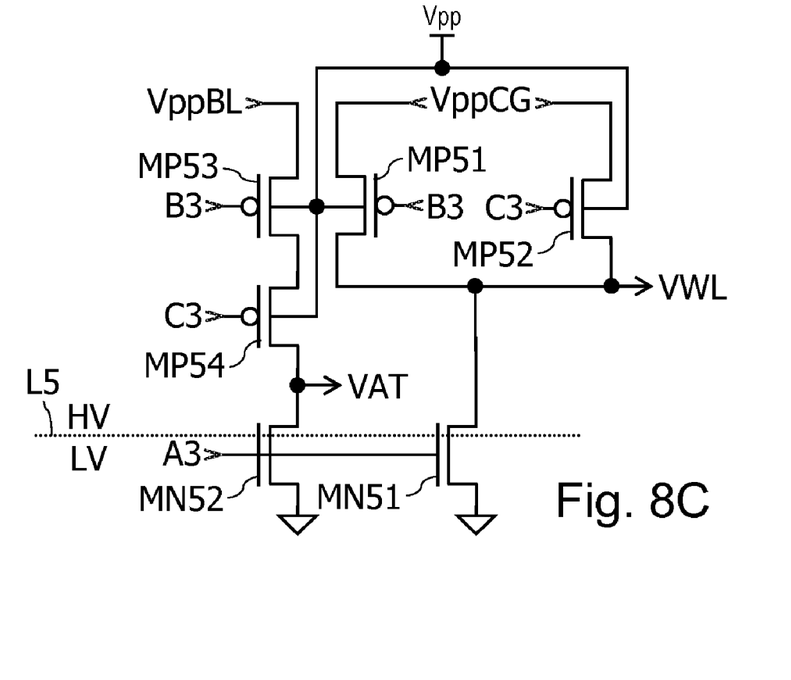

FIGS. 8A to 8C show circuits of a word line latch RLi. In FIG. 8A, each latch RLi comprises two inverting gates I5, I6 mounted back-to-back, forming a low voltage latch. The terminals of the gates I5, I6 supply signals A3 and A4. The signal A3 is applied to a branch comprising several NMOS transistors MN31-1, MN31-2, . . . , MN31-n and MN32 in series, the source of the transistor MN32 being connected to the ground. The gates of the transistors MN31-1 to MN31-n receive a respective address bit signal ADH1, ADH2, ADH3, . . . , and the gate of the transistor MN32 receives a decoding validation signal DEN. The signal A4 is applied to the drain of an NMOS transistor MN34 which gate receives the signal RST and which source is connected to the ground.

In FIG. 8B, each latch RLi comprises six PMOS transistors MP41, MP42, MP43, MP44, MP45 and MP46, and four NMOS transistors MN41, MN42, MN43 and MN44. The sources of the transistors MP45 and MP46, as well as the substrates of the transistors MP41 to MP46 receive the voltage Vpp. The gates of the transistors MP45 and MP46 receive the reference voltage VrefP. The sources of the transistors MP41 and MP42 are connected to the drain of the transistor MP45. The sources of the transistors MP43 and MP44 are connected to the drain of the transistor MP46. The gate of the transistor MP41 is connected to the drain of the transistor MP42, and vice versa, the gate of the transistor MP42 is connected to the drain of the transistor MP41. Likewise, the gate of the transistor MP43 is connected to the drain of the transistor MP44, and vice versa, the gate of the transistor MP44 is connected to the drain of the transistor MP42.

The drain of the transistor MP41 which supplies a signal B3, is connected to the drain of the transistor MN41 which gate receives the signal A3 and which source is connected to the drain of the transistor MN45. The drain of the transistor MP42 is connected to the drain of the transistor MN42 which gate receives the signal A4 and which source is connected to the ground. Likewise, the drain of the transistor MP43 is connected to the drain of the transistor MN43 which gate receives the signal A4 and which source is connected to the drain of the transistor MN46. The drain of the transistor MP44 which supplies a signal C3, is connected to the drain of the transistor MN44 which gate receives the signal A3 and which source is connected to the ground.

In FIG. 8C, each latch RLi comprises four PMOS transistors MP51, MP52, MP53, MP54 which substrates are at the voltage Vpp, and two NMOS transistors MN51, MN52. The transistors MP51 and MP52 receive on the sources thereof the signal VppCG and supply to the drains thereof the signal VWL. The transistor MP51 receives the signal B3 on the gate thereof and the transistor MP52 receives the signal C4 on the gate thereof. The transistor MN51 which source is connected to the ground, receives on the drain thereof the signal VWL and on the gate thereof the signal A3. The signal VppBL is applied to the source of the transistor MP53 which receives on the gate thereof the signal B3. The source of the transistor MP54 is connected to the drain of the transistor MP53. The transistor MP54 receives the signal C4 on the gate thereof and supplies the signal VAT to the drain thereof. The transistor MN52 which source is connected to the ground, receives on the drain thereof the signal VAT, and on the gate thereof the signal A3.

FIGS. 8B and 8C also show in dotted line a line L4, L5 delineating areas of the circuit susceptible of being subjected to a high voltage HV near the voltage Vpp, and areas subjected to a lower voltage LV, the whole circuit of FIG. 8A not being subjected to the high voltage HV. The lines L4 and L5 show that the transistors MP41 to MP46, and MP51 to MP54, as well as the drains of the transistors MN41 to MN44, MN51 and MN52 are subjected to a voltage around Vpp. For reasons similar to those exposed above with reference to FIG. 6, only the transistors MP41 to MP44, MN41 to MN44, MN51 and MN52 are exposed to a risk of gate oxide breakdown.

In addition, the circuit of FIG. 8B comprises two redundant voltage lever shifters respectively supplying the signals B3 and C3 to the input of the circuit of FIG. 8C. Thus, if one of the two voltage lever shifters is faulty due to the failure of one of the transistors MP41, MP42, MN41, MN42 of the first circuit, or one of the transistors MP43, MP44, MN43, MN44 of the second circuit, one of the signals B3 or C3 is still valid. The circuit of FIG. 8C performs the function of an OR logic gate limited in current, receiving in input the signals B3 and C3 and supplying in output the signal VWL, as well as the function of an AND logic gate limited in current, receiving in input the signals B3 and C3 and supplying in output the signal VAT.

The line latch RLi of a not selected line (lowered low voltage latch I5, I6) supplies signals VWL and VAT at 0. The line latch RLi of a selected line supplies, during an erase phase, a signal VWL at the voltage Vpp and a signal VAT at 0. During a write phase, the line latch RLi of a selected line supplies a signal VWL at Vpp or Vcc and a signal VAT at the voltage Vpp.

In the event of failure of a high voltage transistor, the current consumption on the voltages Vpp, VppBL and VppCG remains limited thanks to the transistors MP45 and MP46 which are biased to perform a current limitation function. Typically, the intensity of the signals circulating in the transistors MP45 and MP46, and therefore the intensity of the signals B3 and C3 is limited to a value around 1 µA.

The word line latch RLi which has just been described makes it possible to guarantee that a command for erasing memory cells is performed even if one of the high voltage transistors of the latch has been subjected to a gate oxide breakdown. The word line latch RLi may not activate the signal VAT either if it is not selected, so that a command for programming or reading memory cells may not reach memory cells selected by mistake due to a gate oxide breakdown in one of the latches RLi. To that end, the latch RLi achieves the following conditions. When the signal VWL must be lowered, a breakdown of high voltage transistor may keep it in the lowered state or make it pass by mistake in the raised state. When the signal VAT must be raised, a breakdown of high voltage transistor may keep it in the raised state or let it by mistake in the lowered state. When the signal VWL must be raised, it must not stay by mistake in the lowered state. When the signal VAT must be lowered, it may not pass by mistake to the raised state.

But in the event of breakdown of a high voltage transistor, at least one of the signals B3 and C3 remains valid thanks to the provision of the redundant lever shifters (FIG. 8B). The result is that one of the signals B3 or C3 is no longer valid, i.e., one of these signals remains at the voltage Vpp and the other is in an undetermined state. Thanks to the OR and AND logic functions performed by the circuit of FIG. 8C, the signal VAT remains at 0 knowing that at least one of the two transistors MP53 and MP54 is not conductive. For a selected line, the signal VWL switches to the voltage Vpp during an erase phase, thanks to the transistors MP51 and MP52 in parallel, knowing that at least one of the two transistors is conductive. The result is that the failure of a line latch RLi may not prevent memory cells from being erased, but may only prevent a memory cell of the word to be programmed from being programmed, or cause erasing other memory cells located in the same word line than those to be erased, but in another column.

In addition, the gate oxide breakdown of a gate control transistor CGTk has no effect on erasing or programming a cell of the same column COLk. When reading, the voltage and/or intensity of the signal VWL are limited, which prevents the voltage VCG from becoming excessive, and therefore from reading a programmed state instead of an erased state of memory cell.

Figure 9:
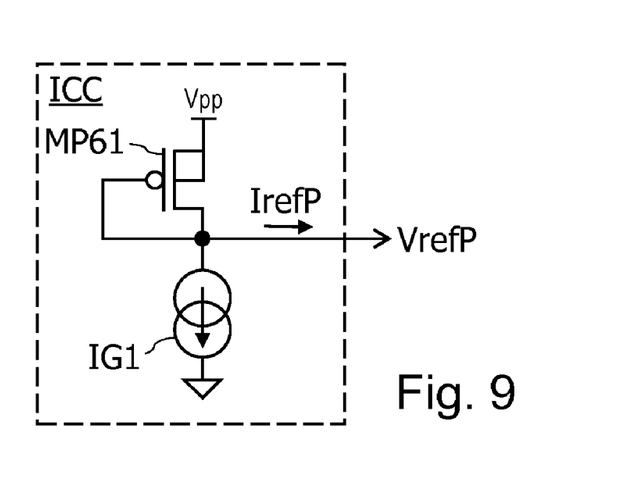
FIG. 9 is a diagram of a current control circuit provided in the memory shown in FIG. 4.

FIG. 9 shows an embodiment of the current control circuit ICC. The circuit ICC comprises a PMOS transistor MP61 having the source thereof receiving the voltage Vpp, and the gate thereof brought onto the drain thereof. The transistor MP61 is arranged in series with a current generator IG1 imposing a maximum current in the transistor MP61. The current IrefP at the voltage VrefP is taken from the source of the transistor MP61. It is preferable that the current IrefP is limited during the write operations at a value around 1 μA, even at a lower value. Thus, the current IrefP may have a value around 100 nA. However, outside the write operations, it is useful not to limit the current IrefP to such low values, so as not to slow down the operation of the latches LPkj, LTk and RLi, and therefore of the memory. Thus, outside the write operations, the current IrefP may be fixed to a value around 10 μA or higher. In the event of breakdown of a high voltage transistor, the current IrefP is supplied by the supply voltage Vpp which is equal to the supply voltage Vcc outside program phases.

Thanks to the circuits described with reference to FIGS. 4 to 8, the default state, for example the erased state is favored in the event of transistor gate oxide breakdown, wherever it is, not only during reading a memory cell, but also during writing (erasing, or programming) a memory cell.

It will be clear to those skilled in the art that the present disclosure is susceptible of various embodiments and applications. In particular, the disclosure may be applied to various other structures of EEPROM memory than that described. For example, the disclosure may also be applied to a memory in which the bits of a word read are sequentially accessed, i.e., a memory comprising only a sense amplifier.

In addition, other read circuits than those described may be provided to determine the value of a bit read in the memory according to the state of the two corresponding memory cells. Indeed, to determine the value of a bit read in the memory, it is not necessary that a state of not faulty memory cell is preponderant over the default state of a faulty memory cell. The read circuit may for example determine if the state of one of the two memory cells corresponding to the data bit to be read is the default state, and supply the state of the other memory cell as the value of the data bit to be read.

Other measures may also be provided in the word line, bit line and column latches so that the state read of defective cells is in a default state.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electrically erasable and programmable memory, comprising:
    memory cells arranged in bit lines and word lines transverse to the bit lines, wherein each memory cell may be in a programmed or erased state;
    selection circuits configured to select and access pairs of the memory cells, each pair including two memory cells belonging to different bit lines and different word lines and configured to store a respective data bit, and configured to avoid a defective memory cell of the memory cells from being written or read by mistake in a state other than a default state after a gate oxide breakdown of a transistor of the defective memory cell; and
    a read circuit configured to determine, for each pair of memory cells, the data bit stored in the pair according to states of the two memory cells of the pair.

2. A memory according to claim 1, wherein the read circuit is configured so that the state of a not defective memory cell of one of the pairs is, for the read circuit, predominant over the default state of a defective memory cell of the one of the pairs.

3. A memory according to claim 1, wherein the memory cells are grouped into word locations and the selection circuits include a word column decoder and a word line decoder configured to select and access pairs of the word locations belonging to different word lines and different word columns, each pair of word locations being configured to memorize a respective word of data.

4. A memory according to claim 1, wherein the default state of the defective memory cell is an erased state, the read circuit comprising an OR logic gate configured to supply a data bit memorized in a selected pair of the pairs of memory cells, according to states of the memory cells of the selected pair.

5. A memory according to claim 1, wherein the default state of the defective memory cell is an erased state, each memory cell comprising a floating gate transistor and an access transistor connected to a terminal of the floating gate transistor, the memory comprising a voltage supply circuit configured to generate a read voltage for reading memory cells, the read voltage being nearer a threshold voltage of floating gate transistor in a programmed state than a threshold voltage of floating gate transistor in the erased state, in order to favor the erased state when reading the memory cell.

6. A memory according to claim 1 wherein the default state of the defective memory cell is a programmed state, the read circuit comprising an AND logic gate configured to supply a bit memorized in a selected pair of the pairs of memory cells, according to states of the memory cells of the selected pair.

7. A memory according to claim 1, wherein the selection circuits include bit line latches, column latches and word line latches to control erasing, programming and reading memory cells, which are configured so that a selected memory cell is read in the default state in the event of a transistor gate oxide breakdown of a transistor of the selected memory cell.

8. A memory according to claim 1, wherein each memory cell comprises a floating gate transistor and an access transistor connected to a terminal of the floating gate transistor and the memory includes a plurality of gate control transistors respectively coupled to the word lines, the selection circuits comprising a word line selection circuit configured to apply a first signal to gates of the access transistors of the cells of a selected word line of the word lines, and a second signal to a gate of the gate control transistor of the selected word line, the second signal being different from the first signal.

9. A memory according to claim 1, wherein the selection circuits include bit line latches, column latches and word line latches to control erasing, programming and reading memory cells, the column latches and word line latches each comprising redundant circuits configured to generate erase or program signals to erase a memory cell to be erased, and prevent a selected memory cell from being programmed by mistake if a transistor of the selected memory cell has a transistor gate oxide breakdown.

10. A method, comprising:
   determining a data bit stored in a pair of memory cells of an electrically erasable and programmable memory, the memory including memory cells arranged in bit lines and word lines transverse to the bit lines, wherein each memory cell may be in a programmed or erased state, the determining including:
      selecting the pair of memory cells by selecting two different bit lines and two different word lines,
      reading the data bit comprising reading states of the memory cells of the pair, and
      determining a value of the data bit according to the states of the memory cells of the pair; and
   preventing a defective memory cell from being written or read by mistake in a state other than a default state after a gate oxide breakdown of a transistor of the defective memory cell.

11. A method according to claim 10, wherein the pair includes the defective memory cell and a non-defective memory cell and determining the value of the data bit includes using the state of the non-defective memory cell and ignoring the default state of the defective memory cell.

12. A method according to claim 10, wherein the memory cells are grouped into word locations, and the selecting includes selecting a pair of word locations by selecting two different word columns and two different word lines to access two different word locations, the word locations of the pair respectively including the memory cells of the pair of memory cells and memorizing a same data word.

13. A method according to claim 10, wherein the default state of the defective memory cell is an erased state, the determining including applying an OR logic function to the states of the memory cells of the pair.

14. A method according to claim 10, wherein:
   the default state of the defective memory cell is an erased state,
   each memory cell includes a floating gate transistor, and
   the reading includes generating a read voltage nearer a threshold voltage of the floating gate transistors in a programmed state than a threshold voltage of the floating gate transistors in the erased state, in order to favor the erased state when reading the memory cells.

15. A method according to claim 10, wherein the default state is an programmed state, the determining including applying an AND logic function to the states of the memory cells of the pair.

16. A method according to claim 10, wherein each memory cell comprises a floating gate transistor and an access transistor connected to a terminal of the floating gate transistor and the memory array includes a plurality of gate control transistors respectively coupled to the word lines, the method comprising applying a first signal to the gates of the access transistors of the cells of a selected word line of the word lines, and applying a second signal to a gate of the gate control transistor of the selected word, the second signal being different from the first signal.

17. A memory, comprising:
   memory cells arranged in bit lines and word lines transverse to the bit lines, wherein each memory cell is configured to be in a programmed or erased state;
   selection circuits configured to select and access pairs of the memory cells, each pair including two memory cells belonging to different bit lines and different word lines and configured to store a respective data bit in common; and
   a read circuit configured to determine, for each pair of memory cells, the data bit stored in the pair according to states of the two memory cells of the pair.

18. A memory according to claim 17, wherein the read circuit is configured so that the state of a not defective memory cell of one of the pairs is, for the read circuit, predominant over the default state of a defective memory cell of the one of the pairs.

19. A memory according to claim 17, wherein the memory cells are grouped into word locations and the selection circuits include a word column decoder and a word line decoder configured to select and access pairs of the word locations belonging to different word lines and different word columns, each pair of word locations being configured to memorize a respective word of data.

20. A memory according to claim 17, wherein the selection circuits include bit line latches, column latches and word line latches to control erasing, programming and reading memory cells, the column latches and word line latches each comprising redundant circuits configured to generate erase or program signals to erase a memory cell to be erased, and prevent a selected memory cell from being programmed by mistake if a transistor of the selected memory cell has a transistor gate oxide breakdown.

* * * * *